(12) United States Patent
Fu

(10) Patent No.: US 12,093,752 B2
(45) Date of Patent: Sep. 17, 2024

(54) PROCESSOR BASED LOGIC SIMULATION ACCELERATION AND EMULATION SYSTEM

(71) Applicant: XEPIC CORPORATION LIMITED, Nanjing (CN)

(72) Inventor: Yong Fu, San Ramon, CA (US)

(73) Assignee: XEPIC CORPORATION LIMITED, Nanjing (CN)

( * ) Notice: Subject to any disclaimer, the term of this patent is extended or adjusted under 35 U.S.C. 154(b) by 501 days.

(21) Appl. No.: 17/448,216

(22) Filed: Sep. 21, 2021

(65) Prior Publication Data

US 2022/0091907 A1 Mar. 24, 2022

Related U.S. Application Data

(60) Provisional application No. 63/081,437, filed on Sep. 22, 2020.

(51) Int. Cl.
*G06F 9/52* (2006.01)
*G06F 9/48* (2006.01)
*G06F 9/50* (2006.01)

(52) U.S. Cl.
CPC .............. *G06F 9/52* (2013.01); *G06F 9/48* (2013.01); *G06F 9/4806* (2013.01); *G06F 9/4881* (2013.01); *G06F 9/50* (2013.01); *G06F 9/505* (2013.01); *G06F 9/5061* (2013.01); *G06F 9/5066* (2013.01)

(58) Field of Classification Search
CPC ........ G06F 9/48; G06F 9/4806; G06F 9/4881; G06F 9/50; G06F 9/505; G06F 9/5061; G06F 9/5066; G06F 9/52
See application file for complete search history.

(56) References Cited

U.S. PATENT DOCUMENTS

| | | | |
|---|---|---|---|
| 2011/0191092 A1* | 8/2011 | Mizrachi | G06F 30/00 718/104 |
| 2017/0193146 A1* | 7/2017 | Larzul | G06F 30/34 |
| 2019/0005177 A1* | 1/2019 | Sharma | G06F 30/331 |

* cited by examiner

*Primary Examiner* — Charles M Swift
(74) *Attorney, Agent, or Firm* — ANOVA LAW GROUP, PLLC

(57) ABSTRACT

An emulation and simulation acceleration system includes a plurality of processors, wherein each of the plurality of processors is configured to run a separate simulation task in a parallel manner. Each of the plurality of processors includes a local memory for instructions and data, a memory space for saving received data from other processors of the plurality of processors. The system includes a plurality of connection channels between each processor of the plurality of processors, wherein each of the plurality of connection channels is either virtual or physical, and each of the plurality of connection channels extends through computer hardware or memory mapping. The system includes a plurality of system interfaces configured to interface with other systems for expansion to a larger system or to connect with external target system. Each of the plurality of system interfaces contains a virtual interface and a physical interface for connecting with other simulators.

3 Claims, 4 Drawing Sheets

PROCESSOR BASED LOGIC SIMULATION ACCELERATION AND EMULATION SYSTEM

PRIORITY CLAIM AND CROSS-REFERENCE

The current application claims priority to provisional application 63/081,437 filed Sep. 22, 2020, the entire contents of which are incorporated herein by reference in their entirety.

BACKGROUND

Vector-based verification methodologies, such as logic simulation and emulation, are still the most popular used electronic design automation (EDA) methods to verify an integrated circuit (IC) design and debug potential bugs in functionality, performance, or power related issues. Examples of these large modern integrated circuit (IC) designs include microprocessors, graphics processing units (GPUs), artificial intelligence (AI) chips, Network routers, etc.

IC design is becoming more complex with verification being a time-consuming step, in the overall IC development flow. People are seeking new methods to accelerate the verification. Among these methods, there are two technologies, simulation acceleration and emulation.

To speed up the simulator, EDA vendors have tried leveraging multiple core general processors. Xcelium from Cadence Design System and VCS from Synopsys Technologies are the two simulators that offer the capability of multi-threads. However, practically the speed up ratio of multi-threading simulator compared with the serial simulator is not high mainly because that the event-based simulation engine core is difficult to unleash the power of multi-core processors.

Emulators have been on the market for twenty years and are widely adopted by large IC designs. There are two types of emulator hardware being popularly used. One is field programmable gate array (FPGA) based, such as the Zebu system from Synopsys. Another is customized processors, such as the Palladium serial system from Cadence. Both of these emulators have advantages and disadvantages. FPGA based emulator usually can run faster at lower cost. But as designs are getting larger, the run time performance drops quickly, limited by the commercially available FPGA architecture. Compile time of FPGA based emulator tends to be long due to the time-consuming place and routing step of FPGA compile procedures. Traditional processors-based emulators usually are able to compile fast, run at decent speed, but tend to have a much higher price tag with high power consumption.

Simulator and emulator are usually being used by different developer groups. Simulator is the tool most often used by hardware engineers for daily verification tasks. Large develop groups use thousands of licenses of simulator. Emulator is the tool usually being used by a much smaller group of engineers for system level verification, software hardware co-verification. Migrating from a simulation environment to an emulation environment takes time, involved the design coding change, testbench modification, etc.

With the new development of simulator technologies and the state of art of multiple central processing unit (CPU) architecture, there is a desire for a general-purpose unified verification engine that can accelerate the simulation engine and is usable as an emulation engine at much higher run time speed.

SUMMARY

Embodiments of the current invention provide a unified emulation and simulation acceleration verification system that can be used as a simulation accelerator and as an emulator. The unified emulation and simulation acceleration system that is able to run on both the commercially available multi-processor computer servers and dedicated multi-processor hardware systems. Unlike other state of art emulation systems processes that design and transform the design into a gate netlist, in some embodiments, the compiler of the emulation system partitions the design directly at the abstraction level of the design, such as Electronic System Level (ESL), Register Transfer Level (RTL), or Gate Level (GL). Each partition of the design can run concurrently on processors as a thread or a process.

The performance of multiple thread or multiple process simulation and emulation heavily depends on the design partition result of load balance of each task, the communication between each task, and the concurrency of each task.

In some embodiments, the partition method of load balancing improves the running of tasks on processors so that the tasks consume a same or similar run time.

In some embodiments, the method processes the input design logic so that the communication and data exchanges between tasks or partitions only at the end or at the start of each evaluation cycle. By limiting the data exchanges to specific timings, the partition method helps to ensure the concurrency of each task.

In some embodiments, the method minimizes the amount of data that is sent from one task to other tasks to reduce the communication time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
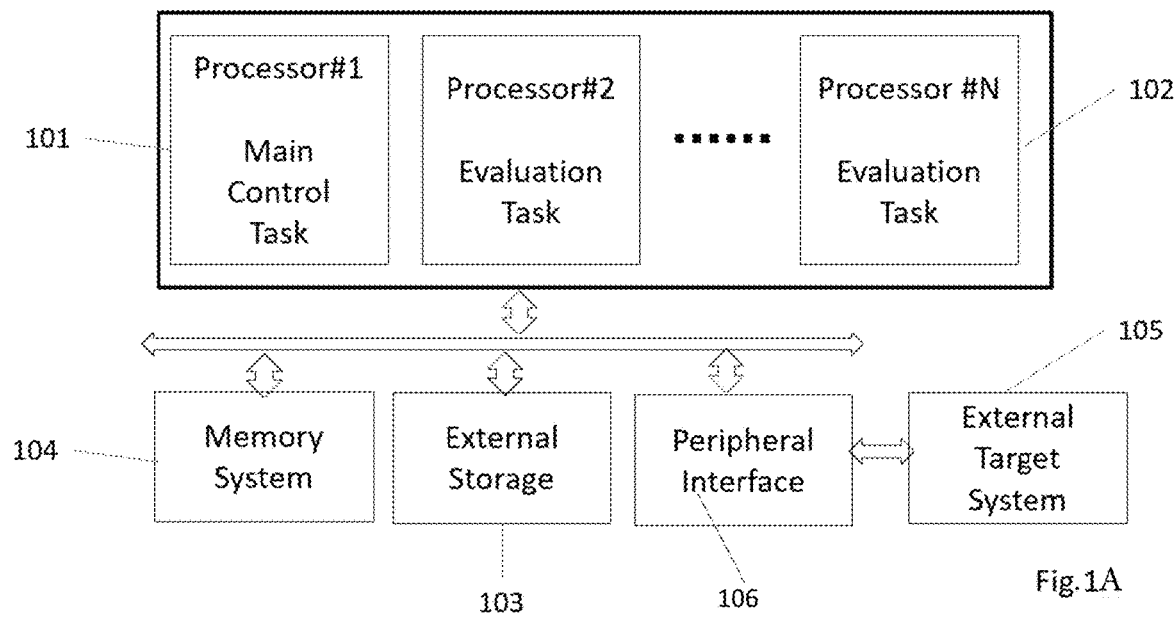
FIG. 1A is an overview of a simulation acceleration and emulation system in accordance with at least one embodiment.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The simulation acceleration and emulation system are able to run on the commercially available computer server, as in FIG. 1A. The IC design logic is compiled and partitioned into multiple tasks, these tasks are able to be concurrently run in multiple processors as multiple threading or multiple processes. A main control task 101 manages the initiation and run time synchronization of all the threads and processes 102, including starting the evaluation of all the evaluation tasks, managing data exchange between the tasks, generating and advancing simulation time, generating the clock and other global primary input signals for the tasks.

Each task is a program that implements part of a function of the design logic. The task also contains the inter-process communication method so that at the end of one evaluation cycle, output data of the tasks will be packaged and shared with other tasks through a shared memory mechanism or other mechanisms. The program is initially stored in an external storage 103, such as hard disk of the computer or a remote network storage, and resides in a computer memory system 104 or the cache inside each processor during a run time.

The simulation acceleration and emulation system is able to communicate with external target system 105 through the peripheral interface 106 of the computer.

Figure 1B:
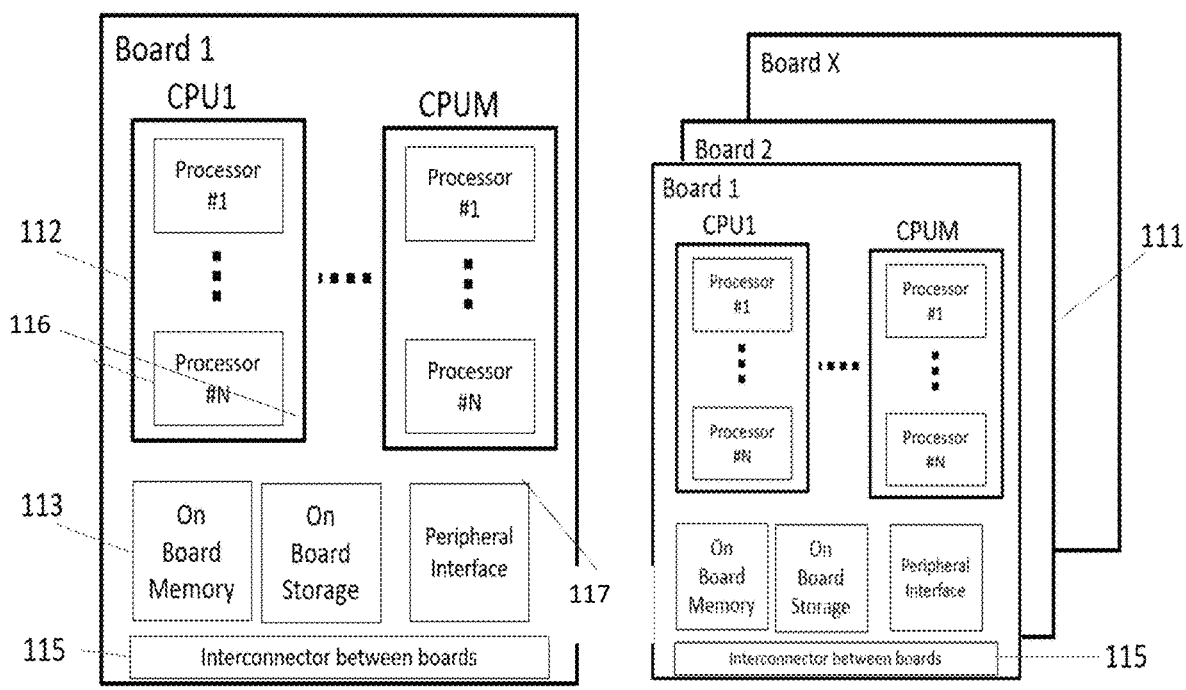
FIG. 1B is an overview of a simulation acceleration and emulation system based on dedicated simulation acceleration and emulation systems in accordance with at least one embodiment.

To be able to support larger size design and improve the run time evaluation speed, dedicated hardware system is developed, as in FIG. 1B. The system contains multiple boards 111. Each board 111 contains multiple CPUs 112 and memories 113, on board storages 116 and peripheral interfaces 117. In some embodiments, each CPU 112 contains multiple processors 114. The system is scalable and able to be configured based on the design size. One system is also usable by several verification projects.

Communication between each processor inside one CPU 112 is performed using shared memory or messaging. Communication between each CPU 112 on a board is performed using a dedicated bus channel, such as a 2-D mesh network, with special designed and structured data package. The data exchange between boards is performed physically through the interconnectors 115. The data package used in between boards is the same as the communication package used in between CPUs 112 on the same board, in some embodiments.

Figure 2:
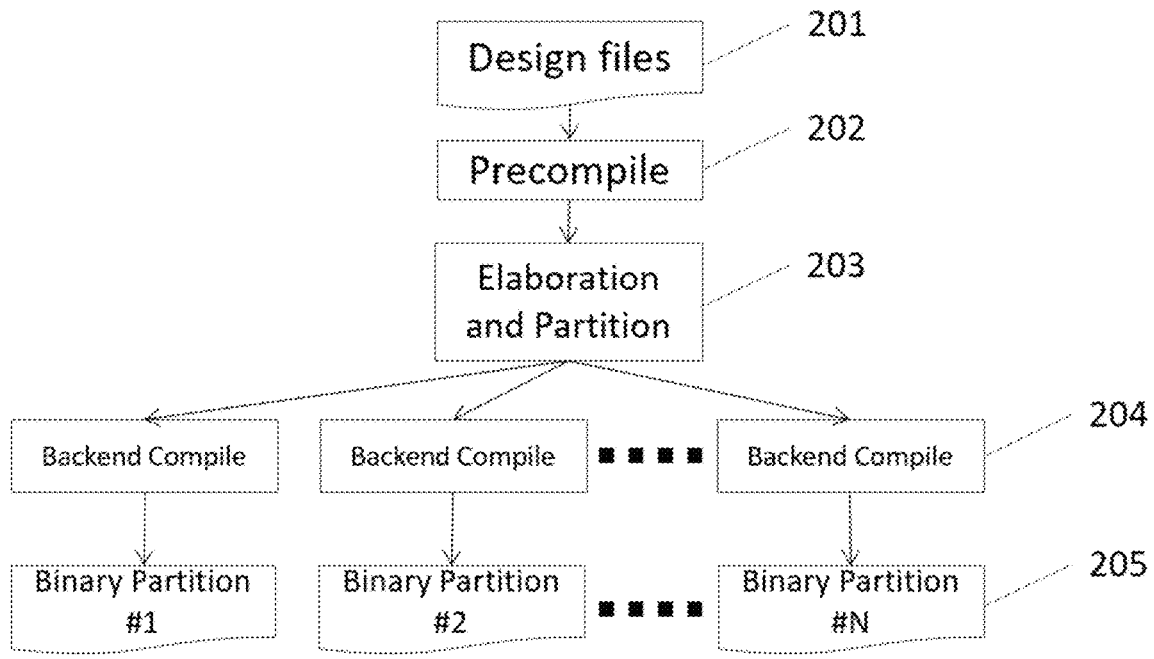
FIG. 2 is a flowchart of a design compile flow in accordance with at least one embodiment.

FIG. 2 is a flowchart of a compile flow of the design. The design files 201, such as RTL and gate netlist are read in. After the design has been precompiled 202 and elaborated 203 and flatten, the design partition 203 is performed. In some embodiments, RTL is taken and partitioned directly following precompiling 202 other than translating or synthesizing into gate primitives. A result of partition is a set of tasks, each representing a part of the design, which is further compiled with backend compiler 204. The result of the backend complier is the binary programs 205 that are able to be run separately on each processor with the multi-threading or multi-process method. The data exchange and communication related code is inserted into the programs so that the tasks are able to exchange data with one another.

Figure 3:
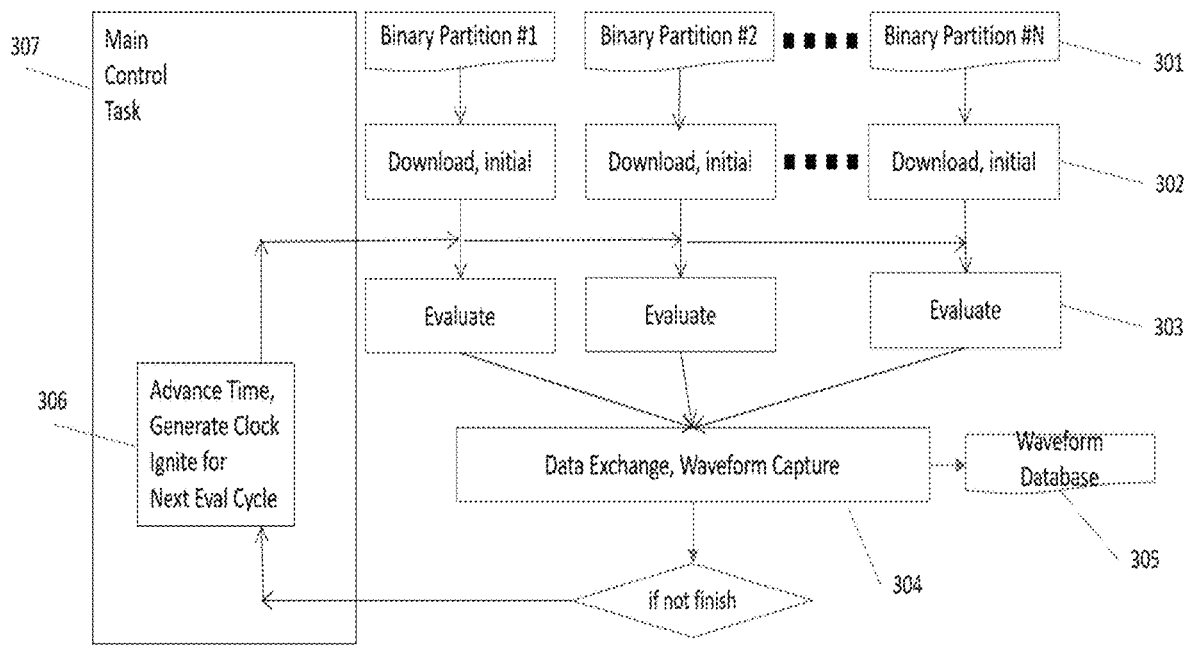
FIG. 3 is a flowchart of a run time flow in accordance with at least one embodiment.

At run time, as in FIG. 3, main control task 307 will manage the task program download 302 of the binary partitions 301 and initialize the tasks. In some embodiments, the binary partitions 301 correspond to the binary partitions 205 in FIG. 2. After the initialization steps mentioned above are completed, main control task 307 will initiate the evaluation 303 of the first design cycle, all tasks run concurrently and send data to other tasks at the end of the evaluation 304. Waveform capture 305 is performed in some embodiments and data is sent to either internal capture memory storage or external storage.

Once all the tasks are done, main control task 307 will perform operation 306, which includes generating the clock, and advancing the clock to a next cycle, then initiating the evaluation of the evaluation of a preceding iteration. This loop continues until the end of whole verification job is completed.

The run time speed of the simulation acceleration and emulation task heavily depends on the load balance of each task, the communication between each task, and the concurrency of each tasks. Partition step 203 contains several methods for a faster run time speed. Related methods, according to some embodiments, are described below.

Design Topology Transform

Figure 4:
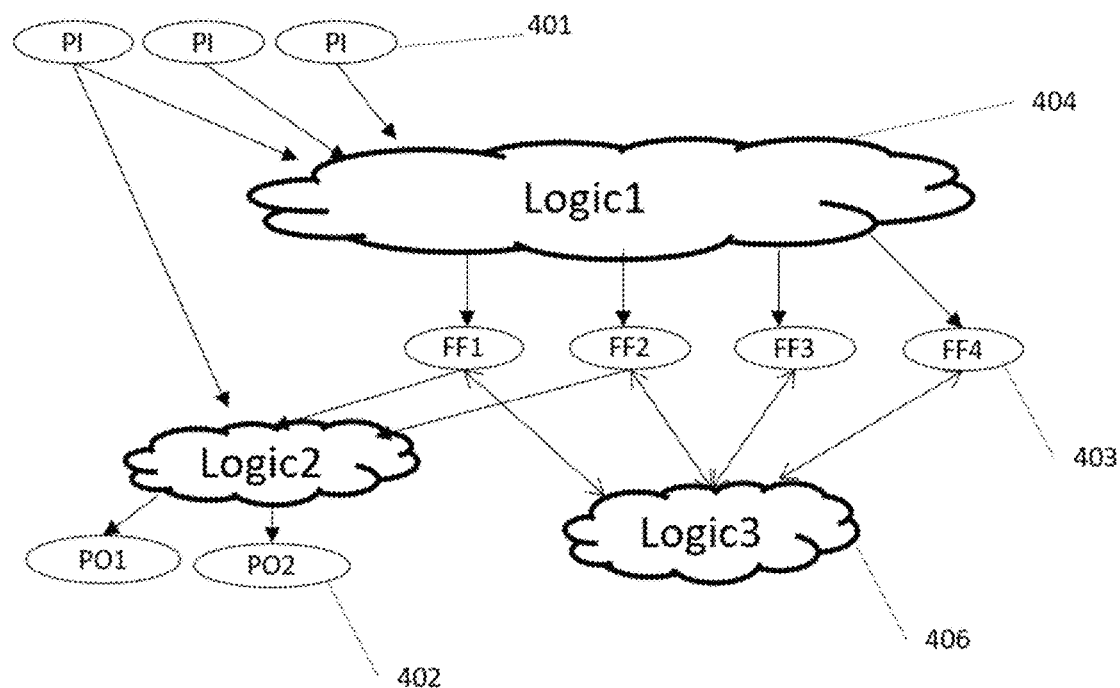
FIG. 4 is a schematic diagram of an original structure of a design in accordance with at least one embodiment.

To be able to partition the design into more tasks, the design topology is transformed. FIG. 4 includes an example logic design. The logic design contains combinational logic 402 and storage cells, such as flip flop 403. In some embodiments, a value of output of the logic is calculated using a primary input 401, and the old value of storage cells. In some embodiments, the value of primary output signal 405 is calculated based on the value of primary input and storage cells. The calculation of combinational logic and storage cells is performed based on an order of tasks. In the example in FIG. 4, the value of logic1, logic2, and logic 3 are calculated first. Then, the value or output of storage cells, such as FF1, FF2, and FF3, are calculated. Value of output signal are calculated after the value or output of the storage cells. The order of calculation helps to ensure precision of function.

Figure 5:
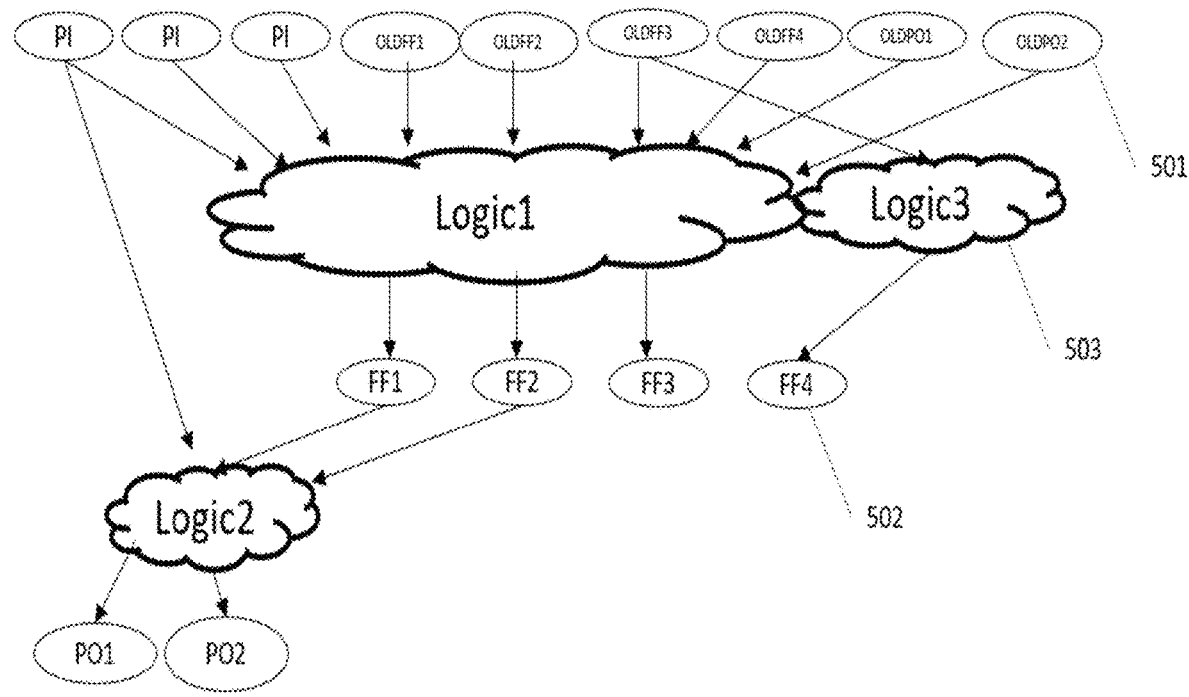
FIG. 5 is a schematic diagram of a transformed design and structure of a design in accordance with at least one embodiment.

As design size and complexity increases, to order and partition the design into several tasks becomes more difficult. The method provides design topology transformation as a first step before partition, as show in FIG. 5. The old value of output of storage cells 502 are added. In FIG. 5, OLD FF1 has the old value of FF1, OLD FF2 has the old value of FF2, etc. After this transformation, the calculation of logic 1 and FF1 depends on primary input PI1 501 and OLD FF2. Performing the calculations in this order helps to make partitioning the design into pieces, logic1 and FF1, logic 2 and FF2, logic3 and FF3 and logic4, easier. Once the calculation of one cycle is completed, the value of FF1, FF2, and FF3 are saved in OLD FF1, OLD FF2, and OLD FF3 for the next iteration of the calculation. In some embodiments, the calculation of the three partitions is performed simultaneously without any dependency on other calculations.

Although the topology of design have been transformed, the functionality of new design is the same as the original design. More than that, the method makes the new design topology easier to compile for multi thread and multi process verification, which further improves the run time speed of simulation using the modern computer system, such as a multi-core processor.

Partition Method

Figure 6:
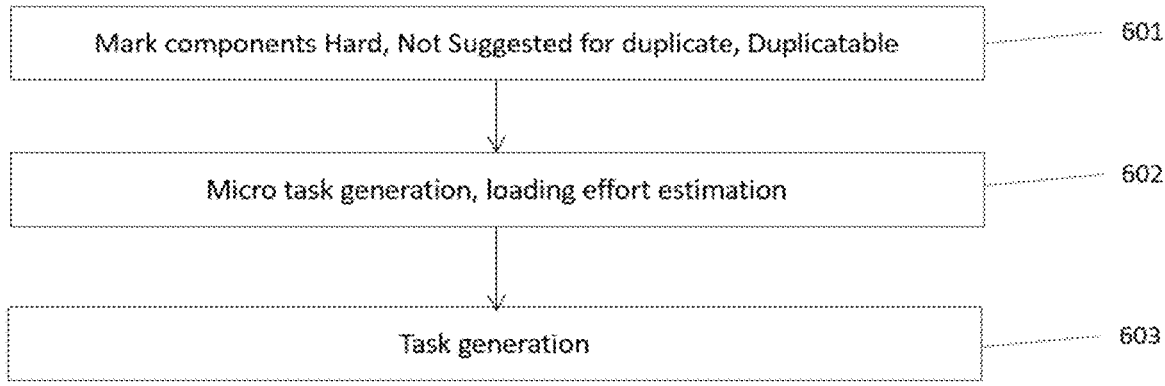
FIG. 6 is a flowchart of a method of design partition in accordance with at least one embodiment.

After the design topology transform mentioned above is done, the design is further processed for partition as in FIG. 6.

First step 601 is to analyze the design and mark some of the design component as "hard." In some embodiments, design components include a set of RTL codes for calculating a combinational logic output, or the set of design code for calculating a value of a storage cell. A large design potentially contains millions of design components. For a better workload balance and reducing the communication among multiple partition in one cycle evaluation, some of the logic components shared by several data path is duplicated into several partitions. However, the cost of duplication could be high. For example, some multiple-port memories should be kept only in one partition without duplication. This kind of design components will be marked as "hard," meaning these components are not to be duplicated. Other components are marked as "not suggested for duplication" or "reproducible," in some embodiments.

Once the above step is done, step 602 is to calculate the loading effort of each component. Design components having different functionality often consume a different number of CPU cycles to calculate the design components. Each component is given a loading number. A component that consumes more computing time is given a higher loading number.

The third step 603 is for task generation. A "task" is a program that is able to run as one thread or one process. In some embodiments, a number of tasks is received from a user. For example, how many CPU/processors will be used in the run time is received from the user, in some embodiments. A task only receives input data at a beginning of one cycle evaluation.

Figure 7:
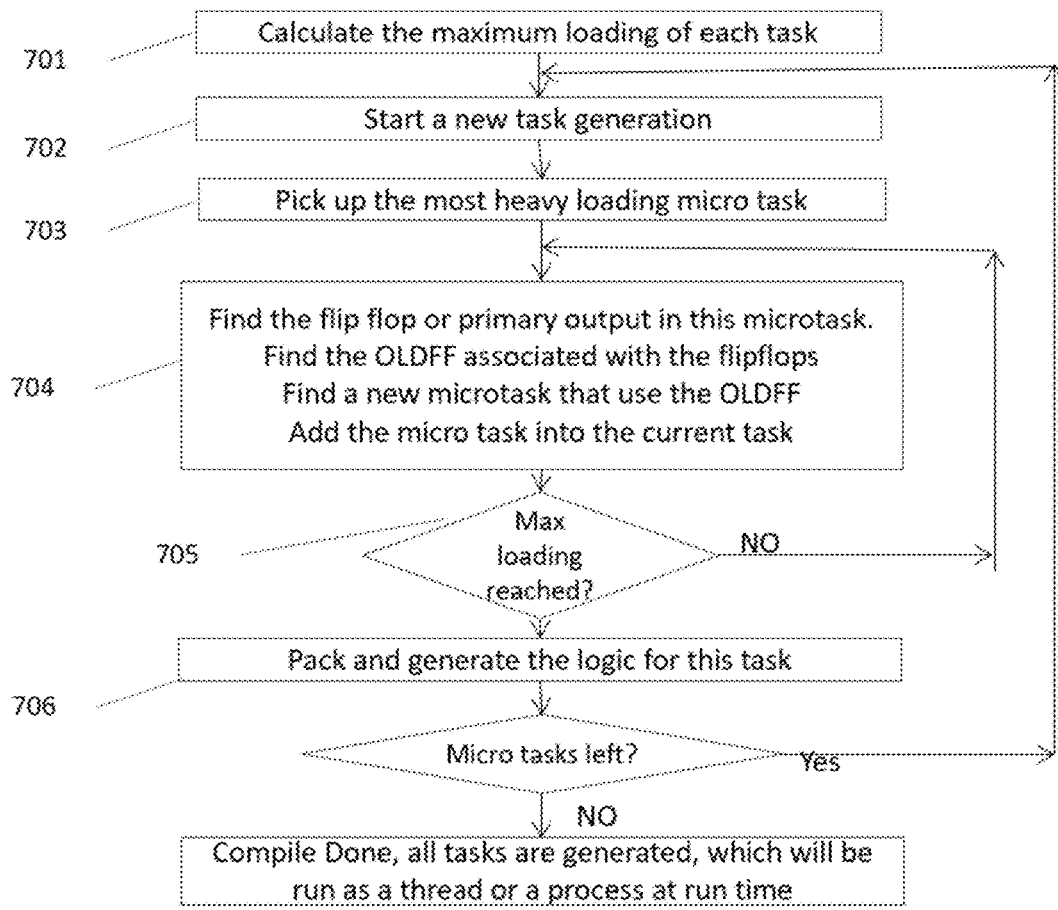
FIG. 7 is a flowchart of a method of the task generation of design partition in accordance with at least one embodiment.

FIG. 7 is an example of the implementations. The estimation of all design components is summed up as the total calculation loading. Dividing the total calculation loading by the number of tasks, gives the estimated maximum loading of each task. For each task, in step 703, one design component is selected. The input of this micro task starts with a highest loading and a component having a "hard" designation. The method will proceed backward to an input and forward to an output so that components connected with the evaluated components are also evaluated and added into the task. This approach continues, until this task has all inputs that are primary input or OLD FFs, and all outputs are primary output or FF. While components are added into the task, the loading number of the added components is added into the task as well. If the total workload of the task has reached a maximum load, the task is "packed," and logic of this task is finalized as in 706. The same flow starts again for a new task, until all components are consumed. At the end of the compiling process, all tasks are generated. These tasks are then run as threads or processes at run time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An emulation and simulation acceleration system comprising:
    a plurality of processors, wherein each of the plurality of processors is configured to run a separate simulation task in a parallel manner, and each of the plurality of processors comprises:
        a local memory for instructions and data,
        a memory space for saving received data from other processors of the plurality of processors;
    a plurality of connection channels between each processor of the plurality of processors, wherein each of the plurality of connection channels is either virtual or physical, and each of the plurality of connection channels extends through computer hardware or memory mapping; and
    a plurality of system interfaces configured to interface with other systems for expansion to a larger system or to connect with external target system, wherein each of the plurality of system interfaces contains a virtual interface and a physical interface for connecting with other simulators;
    wherein at least one of the plurality of processors is configured to partition a design logic, and the partitioning comprises:
        design topology transform comprising adding a previous value of a plurality of storage cells, wherein the design topology transform maintains an original function of the design and improves an ability to partition the design;
        marking logic components inside the design logic as hard or soft, wherein a hard component is a component that all logic depends on, and the hard component is put into a single partition;
        marking the logic components inside the design logic as "not for duplication" or "reproducible";
        duplicating logic components into several tasks;
        load balancing comprising considering a processing load of each of the logic components, and estimating a maximum load of a task of the several tasks, wherein the task comprises multiple logic components; and
        independently running each task on a separate processor of the plurality of processors.

2. The emulation and simulation acceleration system as defined in claim 1, further comprising a control processor configured to manage data synchronous and timing synchronous between running evaluation of each of the plurality of processors.

3. The emulation and simulation acceleration system as defined in claim 1, further comprising a main control task configured to:
    synchronize the evaluation of all tasks running in each of the plurality of processors;
    manage an end of each evaluation cycle,
    manage data exchange the plurality of processors, manage data exchange with other simulation tasks and external physical interfaces; and start a new evaluation cycle.

\* \* \* \* \*